United States Patent
Lee et al.

(10) Patent No.: US 6,258,668 B1
(45) Date of Patent: Jul. 10, 2001

(54) ARRAY ARCHITECTURE AND PROCESS FLOW OF NONVOLATILE MEMORY DEVICES FOR MASS STORAGE APPLICATIONS

(75) Inventors: Peter W. Lee, Saratoga; Hung-Sheng Chen; Vei-Han Chan, both of San Jose, all of CA (US)

(73) Assignee: Aplus Flash Technology, Inc., Santa Clara, CA (US)

( * ) Notice: Subject to any disclaimer, the term of this patent is extended or adjusted under 35 U.S.C. 154(b) by 0 days.

(21) Appl. No.: 09/487,501

(22) Filed: Jan. 19, 2000

Related U.S. Application Data

(60) Provisional application No. 60/167,527, filed on Nov. 24, 1999.

(51) Int. Cl.[7] .................................................. H01L 21/336
(52) U.S. Cl. ......................................... 438/262; 438/257
(58) Field of Search .................................... 438/258, 201, 438/211, 264, 593, 594, 262; 365/185.29, 218, 200

(56) References Cited

U.S. PATENT DOCUMENTS

| | | | |
|---|---|---|---|
| 5,029,130 | 7/1991 | Yeh | 365/185 |
| 5,095,344 | 3/1992 | Harari | 357/23.5 |
| 5,400,279 | 3/1995 | Momodomi et al. | 365/185 |
| 5,828,600 | 10/1998 | Kato et al. | 365/185.11 |

OTHER PUBLICATIONS

Atwood et al., "Intel Strata Flash™ Memory Technology Overview", Intel Technology Journal, 4th quarter 1997, pp. 1–12.

*Primary Examiner*—Matthew Smith
*Assistant Examiner*—Calvin Lee
(74) *Attorney, Agent, or Firm*—George O. Saile; Stephen B. Ackerman

(57) ABSTRACT

In this invention a process for a flash memory cell and an architecture for using the flash memory cell is disclosed to provide a nonvolatile memory having a high storage density. Adjacent columns of cells share the same source and the source line connecting these sources runs vertically in the memory layout, connecting to the sources of adjacent columns memory cells. Bit lines connect to drains of cells in adjacent columns and are laid out vertically, alternating with source lines in an every other column scheme. Wordlines made of a second layer of polysilicon form control gates of the flash memory cells and are continuous over the full width of a memory partition. Programming is done in a vertical page using hot electrons to inject charge onto the floating gates. the cells are erased using Fowler-Nordheim tunneling of electrons from the floating gate to the control gate by way of inter polysilicon oxide formed on the walls of the floating gates.

14 Claims, 5 Drawing Sheets

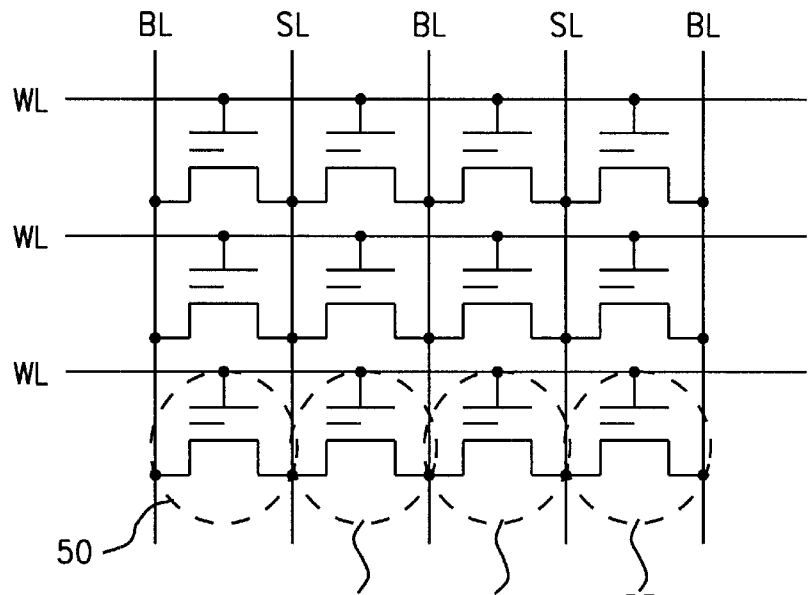
FIG. 3a
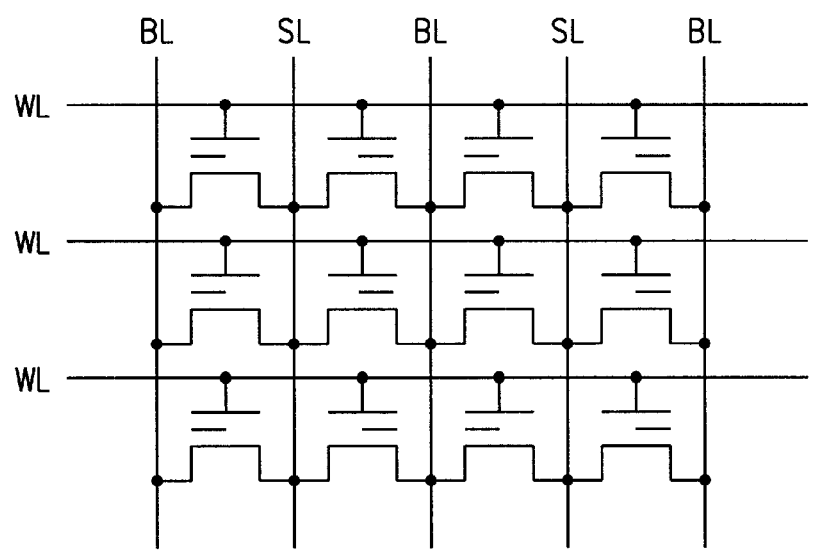
FIG. 3b
|  | WL | BL | SL |
|---|---|---|---|
| Program | Vt/Gnd | Gnd | 12V |
| Erase | 14V | Gnd | Gnd |
| Read | Vcc | 1V | Gnd |
FIG. 4

ARRAY ARCHITECTURE AND PROCESS FLOW OF NONVOLATILE MEMORY DEVICES FOR MASS STORAGE APPLICATIONS

This application claim benefit to Provisional application Ser. No. 60/167,527 filing date Nov. 24, 1999.

BACKGROUND OF THE INVENTION

1. Field of Invention

This invention relates to semiconductor memories and in particular flash electrically erasable and programmable read only memories (EEPROM) for use in mass storage applications.

2. Description of Related Art

A major driving force behind semiconductor flash memory devices has been the cost per bit reduction achieved by reduction of cell sizes by utilizing process scaling techniques. An attempt to accelerate the rate cost reduction has fostered several ongoing activities to develop reliable multiple bits per storage cell devices and reduction in cell size using innovative cell architecture.

In the Intel Technology Journal, 4th quarter 1997, "Intel StrataFlash™ Memory Technology Overview", (Atwood et al.), a stacked gate structure is described in which an ETOX process is used to produce a multiple level cell to store two bit in the same memory cell. In U.S. Pat. No. 5,828,600 (Kato et al.) is described a nonvolatile semiconductor memory where the cells are a MOSFET with a floating gate and have low power, high speed and reduced cell area. An additional objective of the invention is to insure the number of program and erase operations of $10^6$. In U.S. Pat. No. 5,400,279 (Momodomi et al.) discloses a nonvolatile memory device with a NAND cell structure. In U.S. Pat. No. 5,095,344 (Harari) a highly compact flash memory device is disclosed using an intelligent programming technique to allow multiple bits to be stored in each cell and an intelligent erase program to extend the useful life of each cell. In U.S. Pat. No. 5,029,130 (Yeh) a single transistor electrically programmable and erasable memory cell is disclosed using a spit gate which allows the control gate to control a portion of the channel and the floating gate to control the remaining portion of the channel.

There arc several approaches in prior art to form non-volatile memories potentially suitable for mass storage requirements. These approaches range from storing more than one bit of information in a cell to producing highly compact devices to using different architecture that create NAND and AND arrays to minimize the die size. As history has shown there is a relationship between larger memory density, higher utilization and lower memory price, and this seems to track for flash memories as well. Much of the improvement to date has been through smaller geometry's. Flash memory's are used in a wide array of products, and the non volatility makes a flash memory a candidate for mass storage applications.

SUMMARY OF THE INVENTION

In this invention a process is disclosed for a split gate flash memory cell that is laid out in such a way as to promote a highly integrated and tightly coupled array to promote high density. An array scheme is shown to demonstrate how the split gate cells are operated to minimize array size and at the same time avoid unwanted disturb conditions using program and erase block partitions. This produces a small and compact design, and achieves a high storage density with a long operating life making the invention useful for mass storage applications.

The process used to develop the spit gate flash memory cell is based on conventional CMOS processes. A plurality of wells are formed in a semiconductor substrate and a gate oxide layer is grown on the substrate. The wells are ion implanted to adjust, Vt, the threshold voltage of the well. A layer of polysilicon is deposited on the surface of the substrate with a layer of dielectric deposited on top of the polysilicon. The combination of the dielectric and the polysilicon are etched to form a plurality of floating gate structures. Disposable spacers are formed on the sides of the floating gate structures. The floating gate structures are sufficiently thick to produce an offset to allow an adequate select (control) transistor channel length. The thickness of the dielectric in the floating gate structure also reduces the floating gate to control gate capacitive coupling.

After the floating gate structures have been formed with disposable sidewall spacers, drains and sources are ion implanted into the substrate using the floating gate structure as a mask. Photo resist is applied to the wafer and areas over the implanted sources including a portion of the floating gate structures are opened up so that the sidewall spacers adjacent to the implanted sources can be removed. After the sidewall spacers on the source side are removed, a double diffused source is ion implanted into the area of the substrate previously implanted to contain the source of the split gate transistors. The source of each transistor is ion implanted into the substrate to bring the source close to the edge of the floating gates without the removed sidewall spacer. The masking step to remove the source side sidewall spacer is also used for double diffusing the source implant and ion implanting the source up to the edge of the floating gates.

After the photoresist is removed an isolation oxide is formed over the areas of the drains and sources. The disposable sidewall spacer remaining on the floating gate structure retards the isolation oxidation at the floating gate polysilicon layer. The remaining spacer is removed and an interpoly dielectric is grown on the sides of the floating gate. A second layer of polysilicon is deposited and the control gates of the split gate flash memory cells are masked and etched in the form of word lines that extend the length of a row of a memory array.

The split gate flash memory cells are arranged on the semiconductor substrate such that bit lines and source lines run vertically between the split gate flash memory cells. The sources are shared with a first column of cells on one side of a particular column of memory cells and the drains are shared with a second column of cells on the other side of the particular column of memory cells. Each source line is connected to the sources of two columns of flash memory cells and extends the full height of the memory array. Each bit line is connected to the drains of two columns of flash memory cells and extends the full height of the memory array. The second level polysilicon used to form the control gates (also known as select gates) of the stacked gate memory cells forms the wordlines of the memory array which extends across the width of the array. Each wordlines run orthogonal to the source lines and the bit lines and connect the control gates of each split gate memory cell in a memory row together.

A split gate flash memory cell can be thought of as two transistors in series, a select transistor controlled by the control gate and the memory transistor controlled by the floating gate. During programming a voltage which is approximately equal to the threshold voltage, Vt, of the select transistor is applied to the wordline connected to the control gate of the cell being programmed. The voltage on the wordline is sufficient to turn on the channel of the select transistor. The drain is at zero volts when the cell is to be programmed and at Vdd when the cell is not to be programmed. When the cell is to be programmed, the drain is biased at zero volts, and the source is at a high positive voltage. The source to drain voltage difference generates hot electron in the channel of the memory cell to be programmed. The source is capacitive coupled to the floating gate, and the field between the floating gate and the source efficiently transports channel hot electrons onto the floating gate of the cell being programmed.

Programming cells in a memory array of this invention is done in a vertical page associated with a source line. Since two columns of memory cells are connected to the same source line, the bit line connecting to the drains of the column of cells not to be programmed is connected to Vdd. The source line connected to the cell to be programmed is at a high voltage and the wordline connected to the cell to be programmed is at Vt. All other source lines, bit lines and wordlines are biased at zero volts. Programming the next transistor in the vertical page becomes a matter of changing the voltages on the wordlines from Vt to zero on the cell that was just programmed and from zero volts to Vt on the wordline connected to the next cell to be programmed in the vertical page. Changing pages requires bit line and source line voltages to change. It should be noted that to program a logical zero on a floating gate the wordline voltage is Vt and electrons are coupled to the floating gate raising the threshold voltage of the memory transistor so that the cell will not conduct. To inhibit programming, the wordline voltage is zero volts. A wordline voltage of zero volts does not program any electrons onto the floating gate; therefore, cells not being programmed in the same vertical page are also connected to wordlines with zero volts. For multilevel cells (MLC), source bias is ramped over a range of voltages. The wordline voltage of the target cell is initially set to Vt to allow programming. Once the target cell Vt has been reached, the wordline voltage is set to 0V to stop programming.

Cells are erased using a horizontal page or block. All bit lines and source lines are biased to zero volts as well as those wordlines connected to cells not involve in an erase operation. To erase a page, or block, of cells, the wordlines connecting to the cells to be erased are biased to a high positive voltage. In the cells being erased Fowler-Nordheim tunneling is used between the floating gate and the control gate. The floating gate polysilicon oxidation process provides a uniform field enhanced tunneling injector along the edges of the floating gate. The low coupling ration between the control gate and the floating gate provides a significant voltage drop across the inter polysilicon oxide and a local field is developed primarily along the edges of the floating gate. The transfer of charge is rapid and is eventually limited by an accumulation of positive charge on the floating gate until there is insufficient voltage drop to sustain the Fowler-Nordheim tunneling.

The removal of negative charge from the floating gate leaves a net positive charge such that the memory cell's threshold voltage is lowered, enabling the cell to conduct when a reference voltage is applied to the wordline during a read operation, producing a logical one. To read a flash memory cell, bit lines and source lines are floating except for the source line and bit line connected to the cell to be read. The bit line of the cell to be read is at a positive voltage and the source line is connected to circuit ground through a sense amplifier. The wordline connected to the cell to be read is at a reference voltage and all other wordlines are at zero volts.

BRIEF DESCRIPTION OF THE DRAWINGS

This invention will described with reference to the accompanying drawings, wherein:

FIG. 3a shows a split gate flash memory cell.

FIG. 3b show a horizontal split gate flash memory cell.

FIG. 4 shows typical voltages for programming, erasing and reading the cells of FIGS. 3a and 3b.

DETAILED DESCRIPTION OF THE PREFERRED EMBODIMENT

Figure 1A:
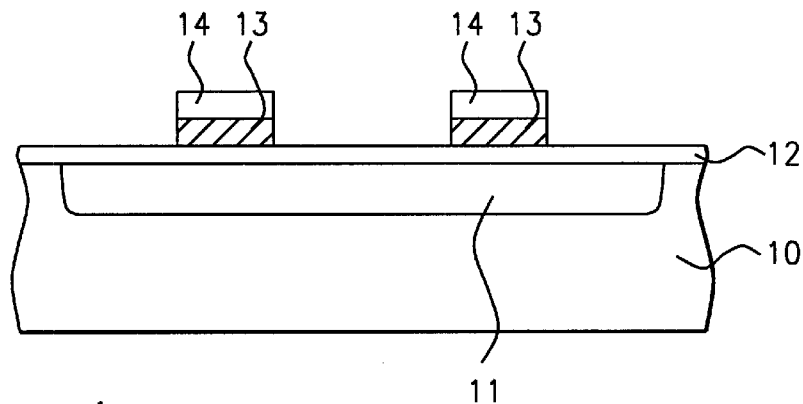
FIG. 1a through 1f show steps in the process for creating the flash memory cell of this invention, FIG. 2a a circuit diagram and bias conditions for programming a cell in a vertical page while inhibiting programming in surrounding cells.

In FIG. 1a is shown a semiconductor substrate 10 with an ion implanted well 11. Before implanting the well, an isolation (field oxidation or shallow trench) is formed for the peripheral circuits of the memory chip. The well is ion implanted to establish the intrinsic voltage threshold of the well. On top of the substrate is a layer of oxide 12 formed after the well 11 is implanted into the substrate. A layer of polysilicon is deposited on the surface of the substrate and on top of the polysilicon an oxide layer is deposited. The oxide layer and the polysilicon are masked and etched leaving a plurality of floating gate structures over the well comprising of a layer of polysilicon 13 over which is a thick layer of oxide 14.

Figure 1B:
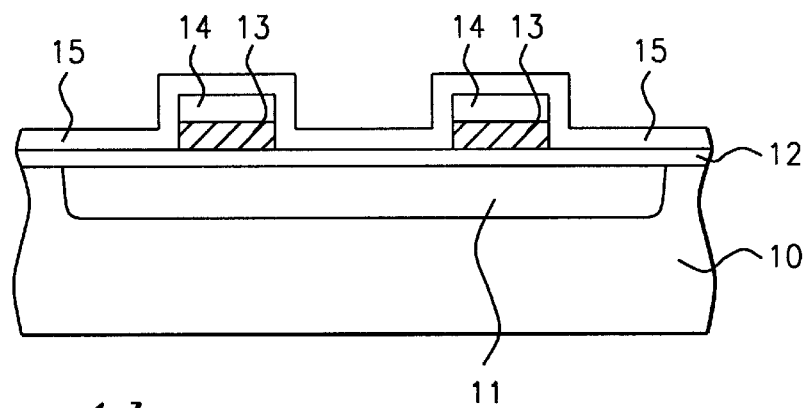

In FIG. 1b is shown a layer of material 15, made from a dielectric (oxide, a nitride, polysilicon or similar material) and used to form a disposable spacer 16 (shown in FIG. 1c) on the side walls of the floating gate structures 13 14. The thickness of the floating gate structure 13 14 provides a spacer size to create an offset that becomes the select channel length under the control gate of the split gate transistor that is being formed.

Figure 1C:
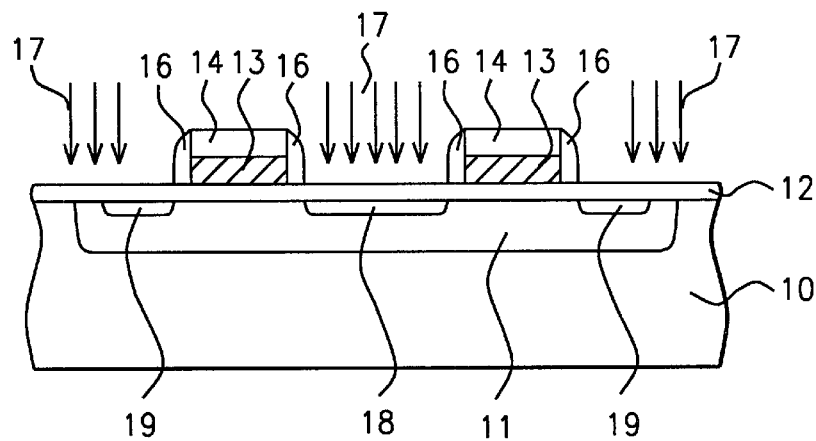
Figure 1D:
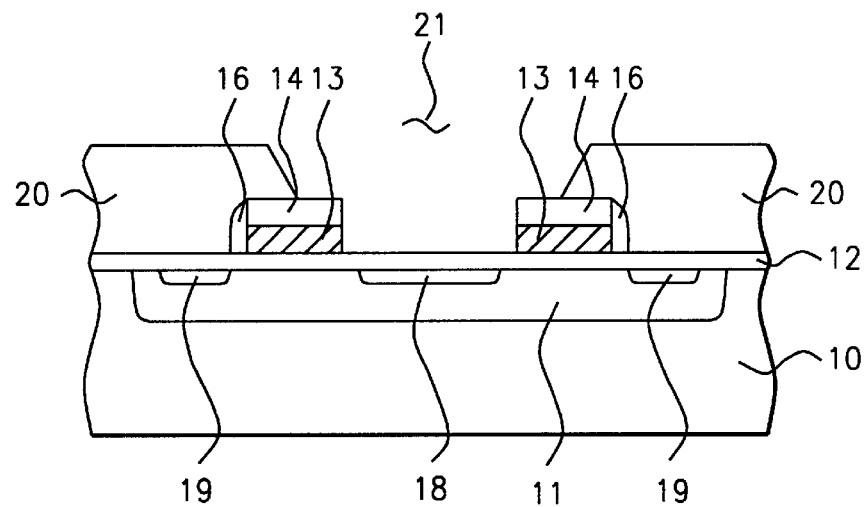

In FIG. 1c is shown the disposable sidewall spacers 16 that were formed on the walls of the floating gate structure 13 14. Using the floating gate structure 13 14 with the sidewalls 16 as a mask drain region 19 and source region 18 are ion implanted 17 into the substrate 10. A layer of photoresist 20 is applied, and an area over the source regions 18 and a portion of the floating gate structures 13 14 is masked and photo resist removed 21, as shown in FIG. 1d. The exposed sidewall spacers adjacent to the implanted source 18 within the opening in the photo resist are removed leaving the spacers 16 on the drain 19 side of the floating gate stack 13 14.

Figure 1E:
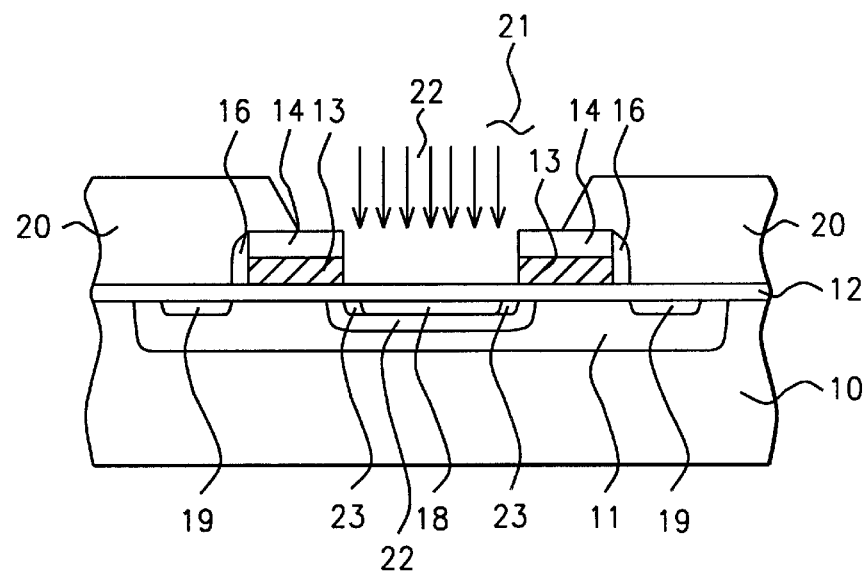

In FIG. 1e once the sidewall spacers within the opening 21 in the photoresist 20 have been removed, a double diffused source 22 is ion implanted 22 and going deep into the substrate 10. The source 18 is then again ion implanted 22 to fill the region 23 under the location of the removed sidewall spacers. this brings the source 18 up to the proximity of the floating gate 13. After the ion implantation 22 the photoresist 20 is stripped from the substrate 10. Isolation oxide 24 is grown over the drain 19 and source 18 23 regions. as shown in FIG. 1f.

Figure 1F:
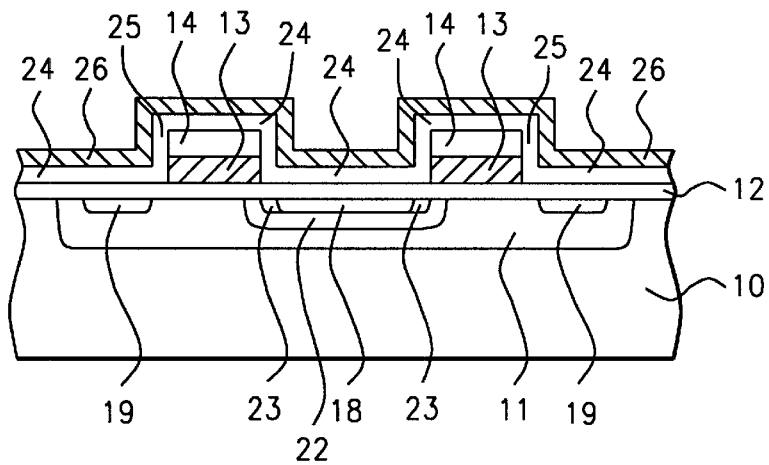

Continuing to refer to FIG. 1f, the sidewall spacer 16 on the drain side on the floating gate structure 13 14 retards oxidation at the sidewall of the floating gate 13. The disposable sidewall spacers 16 are removed from the drain 19 side of the floating gate structure 13 14, and inter-polysilicon dielectric 25 is grown to a thickness of approximately about 150 Angstroms on the side of the polysilicon floating gate 13. The second layer 26 of polysilicon is deposited on the surface of the substrate 10. The second layer 26 of polysilicon is masked and etched to form control gates of the memory cells and at the same time wordlines in a continuous integral combination extending across rows of the memory. The inter-polysilicon dielectric 25 provides a tunneling path between the floating gate 13 and the control gate 26. The thickness of the dielectric 14 of the floating gate structure 13 14 provides a low coupling between the control gate 26 and the floating gate 13. This low coupling produces a significant voltage drop across the inter-polysilicon dielectric 25 allowing a rapid charge transfer from the floating gate 13 to the control gate during a Fowler-Nordheim erase.

Figure 2A:
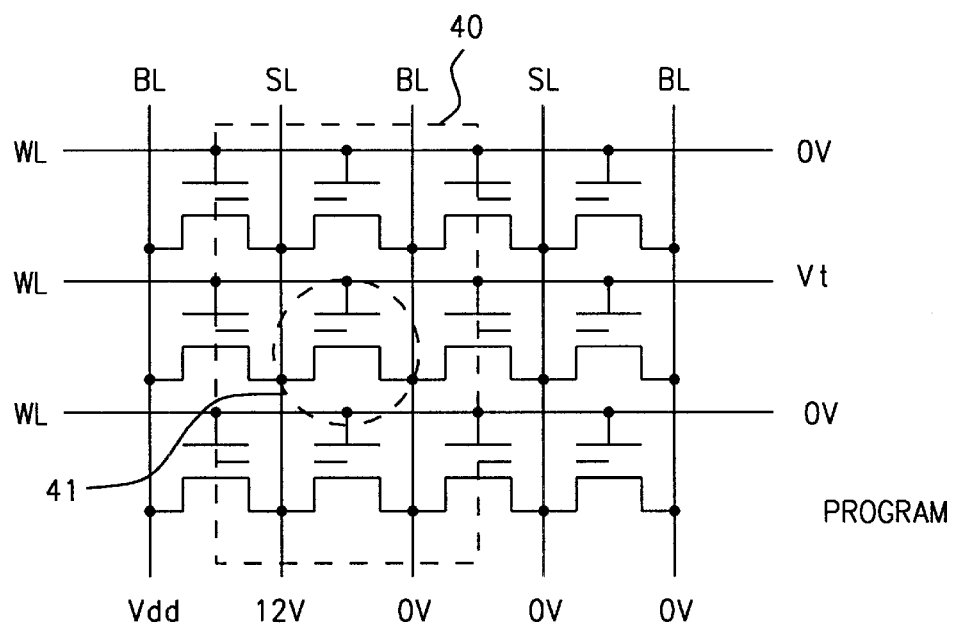
FIG. 2b shows a circuit diagram and bias conditions to erase cells in a horizontal page or block while inhibiting the erasing of surrounding cells.
FIG. 2c shows a circuit diagram and bias conditions to read a flash memory cell while inhibiting reading surrounding cells.

In FIG. 2a is shown a four column by three row section of a flash memory using split gate flash memory cells biased for programming. Alternate vertical lines are source lines (SL) and bit lines (BL), each connecting to two adjacent columns where the bit lines connect the drains of the cells in the columns to a sense amplifiers which is not shown. The horizontal lines are wordlines (WL) which connect to the control (select) gates of each cell in a row of cells. The voltages necessary to program a cell are shown on the opposite end of each line from its letter designation.

Continuing to refer to FIG. 2a, a vertical page 40 is shown as a dashed line outline. Contained within the vertical page 40 is a split gate flash memory cell 41 to be programmed and outlined as a dashed circle. The split gate flash memory cell 41 transistor has a portion of its channel under a stacked gate configuration where the control gate and the floating gate are stacked together and is called the "memory transistor". The other portion of the channel of the spit gate flash memory cell 41 transistor is below only the control gate and is called "the select transistor". The SL connected to the source of the cell 41 to be programmed is set to a high voltage of approximately about 12 V, and the BL connected to the drain of cell 41 is set to 0 V. The WL connected to the control gate of the cell 41 to be programmed is set to a value which is approximately equal to the threshold voltage Vt of the select transistor of the spit gate flash memory cell. The column to the left of the column containing cell 41 is part of the vertical page 40, and the bit line connected to the drains of this column is set to the reference voltage, Vdd, which is high enough in value to cut off the selector transistor of split gate flash memory cells in this column on the left side of the vertical page. The remaining bit lines (BL), source lines (SL) and wordlines (WL) are connected to 0 V to prevent conduction in cells to which they are connected when a cell in these other columns is connected to the wordline voltage Vt.

Continuing to refer to FIG. 2a, The cell to be programmed 41 is in its un-programmed state has a floating gate threshold that is positive and is non-conducting with the wordline at a reference voltage during a read cycle. During programming the control gate which is connected to the wordline WL is set to a voltage that is approximately equal to the threshold voltage Vt. This transfers the drain voltage 0 V from the bit line BL across the select transistor portion of the split gate memory cell. A high voltage having a preferred value of approximately about 12 V with a minimum value of approximately about 6 V, and a maximum value of approximately about 18 V is connected to the source of cell 41 causes a voltage differential that generated hot electrons in the channel of the memory cell 41 being programmed. The field between the channel and the floating gate transfers hot electrons from the channel to the floating gate. The programming process is self limiting as electrons accumulate on the floating gate and the channel current is low allowing a charge pump to be used to generate the high source voltage. For multilevel cells (MLC) the source bias is ramped from approximately about 6 V to approximately about 14 V. The WL of the target cell to be programmed 41 is set to Vt. Once the target cell 41 voltage threshold has been reached, the WL connected to the gate of the target cell 41 is set to 0 V, stopping programming.

Figure 2B:
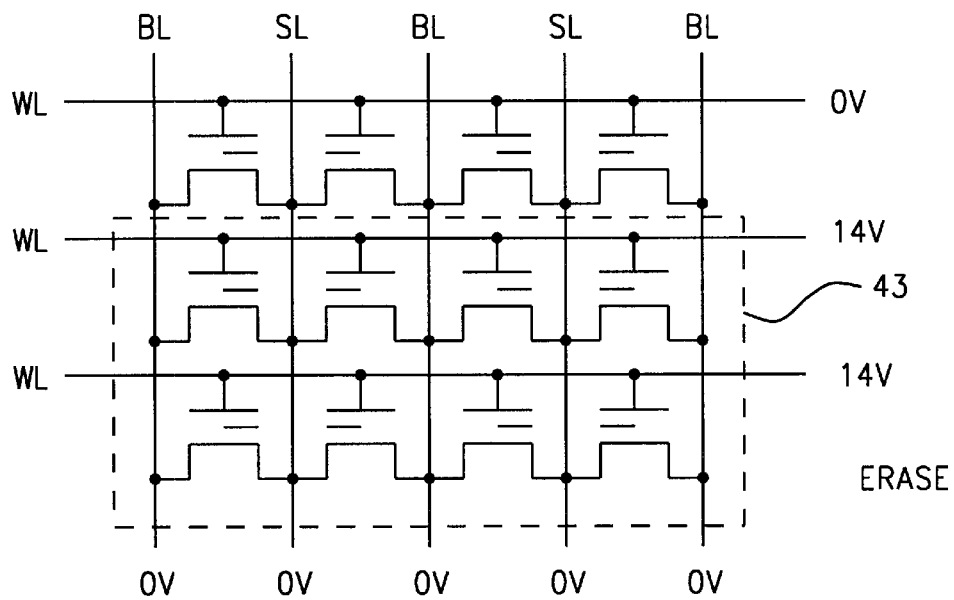

In FIG. 2b is shown the same four by three matrix of a flash memory that is conditioned by voltages to perform an erase by inducing Fowler-Nordheim tunneling between the control gate connected to a WL and the floating gate. As can be seen from FIG. 2b all BL, SL and WL are connected to 0 V except the two wordlines connected to a high voltage with a preferred value of approximately about 14 V, a minimum value of approximately about 8 V, and a maximum value of approximately about 20 V. A horizontal page (block) 43 is shown outlined in FIG. 2a containing two rows of flash memory cells. With the voltage conditions shown, the two rows with the wordlines biased to approximately about 14 V will be erased. Fewer rows or more rows can be erased at once depending on how many wordlines are biased to approximately about 14 V.

Continuing to refer to FIG. 2b, The sources connected to SL and the drains connected to BL, are grounded and the control gates connected to wordlines of the cells to be erased are at a high voltage. The floating gate polysilicon oxidation process provides a high field enhanced tunnel injector to the control gate along the edges of the floating gate to promote Fowler-Nordheim tunneling. This repeatable manufacturing process produces a consistent oxide integrity and minimizes endurance induced degradation. The thickness of the dielectric on top of the floating gate produces a low coupling to the control gate which in turn promotes a high voltage drop across the inter-polysilicon oxidation with the field generated primarily along the edges of the floating gate.

Figure 2C:
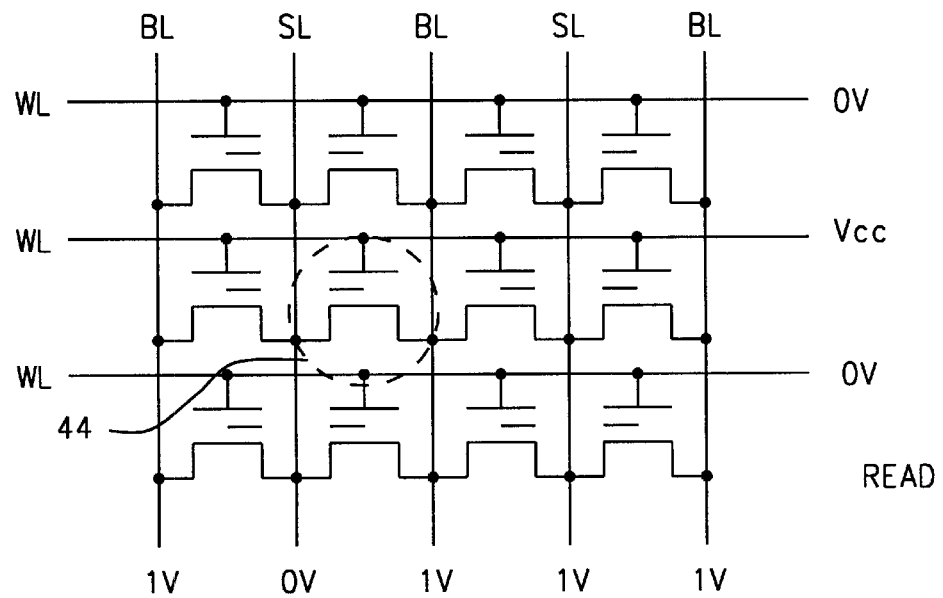

In FIG. 2c is shown the conditions to read a memory cell 44. The SL connected to the cell to be read 44 is set to 0 V and the BL connected to the drain of the cell to be read is at a preferred value of approximately about 1 V with a maximum value of approximately about 5 V and a minimum value of approximately about 0.5 V. All other bit lines BL and source lines SL are set at approximately about 1 V. The WL connected to the cell to be programmed 44 is biased to Vcc and all other wordlines WL are biased to 0 V. If the floating gate of the memory cell being read 44 has not been programmed, the split gate flash memory cell will conduct and current will flow through the sense amplifier indicating a logical one. If the floating gate of the memory cell being read 44 has been program ed, the split gate flash memory cell will not conduct and no current will flow through the sense amplifier indicating a logical zero.

Continuing to refer to FIG. 2c, two columns share a common source line, and if the source line is biased at 0 V and a word line is biased at Vcc, then one of the two cells 44 is read by a sense amplifier if cell 44 is selected to be connected to a sense amplifier. The other cell sharing the same word line and source line is not connected to a sense amplifier and is not read even though the bias conditions are such to permit a read operation. This capability unlike a traditional design is a result of the flash memory array being a virtual ground configuartion.

In FIG. 3a is shown an alternative orientation of the split gate flash memory cell as compared to the orientation shown in FIGS. 2a, 2b and 2c. In FIG. 3a the wordlines are horizontal and the bit lines and source lines are vertical allowing vertical pages for programming and horizontal pages/blocks for erasing. The split gate cells 50, 51, 52, 53 in each column have the same orientation such that stacked gate portion of a cell 50 is connected to a bit line BL and the select/control portion of the channel of the cell 50 is connected to a source line SL. In the adjacent column the stacked gate portion of the channel of the cell 51 is connected to a source line SL with the bit line BL connected to the select/control gate portion of the channel. Cell 52 and the cells in the column within which it is a member has a similar orientation and connection as cell 50 and cell 53 and the cells in the column within which it is a member is oriented and connected similar to cell 51.

In FIG. 3b is shown another possible orientation of the split gate flash memory cells that is the opposite of that shown in FIGS. 2a, 2b, and 2c. In FIG. 3b the stacked gate portion of the channel of each cell are connected to a bit line BL, and the select/control portion of the channel of each cell is connected to a source line SL. The orientation of the cells in each column and between columns are such that wordlines are horizontal and the bit lines and source lines are vertical allowing vertical pages for programming and horizontal pages/blocks for erasing.

In FIG. 4 is shown typical voltages for programming, erasing and reading the cells in FIGS. 3a and 3b. To program a Jell the wordline connected to the cell is set to Vt or ground (Gnd), the bit line is grounded (Gnd) and the source line connected to the cell is supplied with approximately about 12 V. To erase a cell the wordline connected to the cell is set to approximately about 14 V with the bit line and source line connected to the cell to be erased each connected to ground (Gnd). To read a cell the wordline connected to a cell is set to Vcc, the bit line connected to the cell is set to approximately about 1 V and the source line id grounded (Gnd). The voltages in FIG. 4 are the same as shown in FIGS. 2a, 2b and 2c. The other BL, SL and WL voltages necessary to inhibit the cells not being programmed are the same as shown in FIG. 2a. The other BL, SL and WL voltages necessary to inhibit the cells not being erased are the same as shown in FIG. 2b, and the other BL, SL and WL voltages necessary to inhibit the cells not being read are the same as shown in FIG. 2a.

While the invention has been particularly shown and described with reference to preferred embodiments thereof, it will be understood by those skilled in the art that various changes in form and details may be made without departing from the spirit and scope of the invention.

What is claimed is:

1. A method to produce an EEPROM for mass storage, comprising:
   a) forming a plurality of polysilicon floating gates with associated sidewall spacers with a dielectric layer thereon upon an oxide layer on a semiconductor substrate above a plurality of wells implanted therein,
   b) ion implanting a plurality of drain and plurality of source regions in said wells using said floating gates with the sidewall spacers as a mask,
   c) double diffusing said source regions with sidewall spacers adjacent to source region removed,
   d) forming isolation oxidation, removing sidewall spacers adjacent to said drain regions and growing an interpoly dielectric,
   e) depositing a layer of polysilicon and forming a plurality of control gates over a plurality of said floating gates.

2. The method of claim 1 wherein, forming a thick floating gate provides a size of said sidewall spacer necessary to produce an offset for a select transistor channel.

3. The method of claim 1 wherein, removing said sidewall spacers adjacent to said drain regions after said isolation oxidation retards oxidation on sides of said floating gates.

4. The method of claim 1 wherein, forming said plurality of control gates over a plurality of floating gates produces a plurality of word lines of a memory.

5. The method of claim 1 wherein, growing said interpoly dielectric provides a uniform field enhanced tunneling injector along edges of said floating gates to minimize endurance induced degradation caused by repeated erasing and reading of charge on said floating gate.

6. The method of claim 1 wherein, forming said floating gates with a thick dielectric is done to minimize floating gate to control gate coupling and allows a high field to be developed along an edge of said floating gate during programming to permit fast charge transfer.

7. The method of claim 1 wherein, double diffusing said source regions and removing said sidewall spacers adjacent to source region is done with a shared masking step.

8. A method to produce an electrically erasable and programmable (EEPROM) for mass storage applications, comprising:
   a) forming a well in a semiconductor substrate,
   b) implanting ions into said well to establish a threshold voltage,
   c) forming a gate isolation layer on top of said substrate,
   d) forming a floating gate structure comprising a first layer of polysilicon with a dielectric insulator thereupon,
   e) forming sidewall spacers on sides of said floating gate structure,
   f) ion implanting a plurality of drain and source regions in said well using said sidewall spacers as a mask,
   g) removing sidewalls adjacent to said source regions,
   h) double diffusing said source regions,
   i) implanting a source within said source region,
   j) depositing an isolation oxidation on source and drain regions and removing side wall spacers,
   k) growing an interpoly dielectric,
   l) depositing a second layer of polysilicon,
   k) forming a control gate structure from said second layer of polysilicon and covering a plurality of said floating gate structures.

9. The method of claim 8 wherein, forming a thick floating gate structure provides a size of said sidewall spacer necessary to produce an offset for a select transistor channel.

10. The method of claim 8 wherein, removing said sidewall spacers adjacent to said drain regions after said isolation oxidation retards oxidation on sides of said floating gates.

11. The method of claim 8 wherein, forming said plurality of control gates over a plurality of floating gates produces a plurality of word lines of a memory.

12. The method of claim 8 wherein, growing said interpoly dielectric provides a uniform field enhanced tunneling injector along edges of said floating gates to minimize endurance induced degradation caused by repeated erasing and reading of charge on said floating gate.

13. The method of claim 8 wherein, forming said floating gate structure with a thick dielectric is done to minimize floating gate to control gate coupling and allows a high field to be developed along an edge of said floating gate during programming to permit fast charge transfer.

14. The method of claim 8 wherein, double diffusing said source regions and removing said sidewall spacers adjacent to the source region is done with a shared masking step.

* * * * *